United States Patent
Inoue et al.

(10) Patent No.: US 8,355,262 B2
(45) Date of Patent: Jan. 15, 2013

(54) ELECTRONIC COMPONENT BUILT-IN SUBSTRATE AND METHOD OF MANUFACTURING ELECTRONIC COMPONENT BUILT-IN SUBSTRATE

(75) Inventors: Akinobu Inoue, Nagano (JP); Haruo Sorimachi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 1100 days.

(21) Appl. No.: 12/000,729

(22) Filed: Dec. 17, 2007

(65) Prior Publication Data

US 2008/0174978 A1 Jul. 24, 2008

(30) Foreign Application Priority Data

Dec. 19, 2006 (JP) ................. P.2006-341004

(51) Int. Cl.
*H05K 1/18* (2006.01)

(52) U.S. Cl. ........ 361/761; 361/767; 361/773; 361/774; 361/790; 361/803; 257/686; 257/692

(58) Field of Classification Search .............. 361/790, 361/803; 257/685–686; 174/520–523
See application file for complete search history.

(56) References Cited

U.S. PATENT DOCUMENTS

| 5,861,666 | A  | * | 1/1999  | Bellaar        | 257/686 |
| 6,337,445 | B1 | * | 1/2002  | Abbott et al.  | 174/260 |
| 6,489,676 | B2 | * | 12/2002 | Taniguchi et al. | 257/698 |
| 6,828,665 | B2 | * | 12/2004 | Pu et al.      | 257/686 |

FOREIGN PATENT DOCUMENTS

| JP | 03-295266   | 12/1991 |
| JP | 2000-286380 | 10/2000 |
| JP | 2003-347722 | 12/2003 |
| JP | 2004-260065 | 9/2004  |
| JP | 2005-311019 | 11/2005 |

\* cited by examiner

*Primary Examiner* — Tuan T Dinh
(74) *Attorney, Agent, or Firm* — Drinker Biddle & Reath LLP

(57) ABSTRACT

An electronic component is provided between at least two wiring boards. An electrode of the electronic component is electrically connected to at least one of the wiring boards. Also, the wiring boards and are electrically connected to each other. Additionally, the gap between the wiring boards and is sealed with a resin. The electronic component built-in substrate is featured in that a bonding pad formed on one of the wiring boards and is electrically connected to an electrode of the electronic component by a bonding wire, and that at least a connection portion between the electrode of the electronic component and the bonding wire is coated with a protection material.

10 Claims, 14 Drawing Sheets

ELECTRONIC COMPONENT BUILT-IN SUBSTRATE AND METHOD OF MANUFACTURING ELECTRONIC COMPONENT BUILT-IN SUBSTRATE

BACKGROUND OF THE INVENTION

1. Technical Field

The present invention relates to an electronic component built-in substrate and to a method of manufacturing an electronic component built-in substrate. More particularly, the invention relates to an electronic component built-in substrate capable of reducing the height and the planar dimension thereof and enhancing the reliability of the electrical connection between an electronic component and a wiring board, and also relates to a method of manufacturing such an electronic component built-in substrate.

2. Related Art

With the enhancement of the performance of electronic apparatuses, electronic component built-in substrates, on each of which electronic components are densely mounted, have been developed. Some of such electronic component built-in substrates are configured so that electronic components 30 are mounted between wiring boards 10 as illustrated in FIG. 12, and that the gap between the wiring boards 10 is sealed with a resin 50 (see, for example, FIG. 1 of Patent Document 1).

[Patent Document 1] JP-A-2003-347722

DISCLOSURE OF THE INVENTION

Problems to be Solved by the Invention

An electronic component built-in substrate illustrated in FIG. 12 uses solder balls 40 for connecting upper and lower wiring boards 10, 20. Thus, an electronic component 30, such as a semiconductor element, having already been mounted between the wiring boards 10, 20 undergoes steps, such as a fluxing step, a solder-ball reflowing step, and a cleaning step, of a manufacturing process before the upper and lower wiring boards 10, 20 are connected to each other. Sometimes, this adversely affects the electronic component 30.

More particularly, when an electronic component, such as a semiconductor element, is mounted on an electronic component built-in substrate by wire-bonding, bonding pads (i.e., aluminum electrodes) of the semiconductor element and bonding wires are exposed to an external environment.

Additionally, the following problems occur. That is, there is a fear that an external force may cause deformation and breaking of the bonding wires. In a case where an acidic drug is used in a cleaning step after the reflowing, corrosion of the bonding pad of the semiconductor element is caused. Thus, it is difficult to mount a semiconductor element on an electronic component built-in substrate by wire-bonding.

Thus, the inventor of the present invention devised structures illustrated in FIGS. 13 and 14, which are obtained according to a first improved method of mounting an electronic component, such as a semiconductor element, on a wiring board by wire-bonding.

As illustrated in FIGS. 13 and 14, the connection portion between an electrode 32 serving as a bonding pad of an electronic component 30 wire-bonded to a wiring board 10 and a bonding wire 60 is sealed with a resin 70 by transfer-molding. Consequently, even when a first wiring board 10 is electrically connected to a second wiring board 20 arranged thereon by a solder ball 40, the reliability of the electrical connection of the connection portion between the electrode 32 of the electronic component 30 and the bonding wire 60 can be assured. Additionally, the bonding wire 60 can be protected. In the case of using this electronic component built-in substrate, the gap between the two boards 10 and 20 is filled with a seal resin 50 after the first wiring board 10 is connected to the second wiring board 20 by the solder ball 40.

However, when the entire electronic component 30 is transfer-molded with the resin 70, a seal portion is formed of the resin 70 on the outer peripheral portion and the top portion of the electronic component 30 as illustrated in FIGS. 13 and 14. This causes a problem that the clearance between the upper board 20 and the lower board 10 is increased to thereby hinder the miniaturization (or reduction in thickness) of the electronic component built-in substrate 100. Also, the increase in the clearance between the upper board 20 and the lower board 10 results in increase in the diameter dimension of the solder ball 40 to be used for connecting the upper board 20 and the lower board 10 to each other. Thus, there is another problem that an increase in the installation area for the solder ball 40 makes it difficult to miniaturize the electronic component built-in substrate 100.

SUMMARY OF THE INVENTION

Accordingly, an object of the invention is to provide an electronic component built-in substrate and a manufacturing method therefor, which can reliably protect a connection portion at the side of an electronic component and can considerably reduce the planar dimension (i.e., the plane area) and the height dimension of the electronic component built-in substrate by keeping a coated range of a wire bonding portion (corresponding to a connection portion) of the electronic component, which is coated with a protection material, to a minimum.

Means for Solving the Problems

To achieve the foregoing object, according to a first aspect of the invention, there is provided an electronic component built-in substrate including:

at least two wiring boards, an electronic component provided between the two wiring boards, and an electrode of the electronic component, the electrode being electrically connected to at least one of the wiring boards, the wiring boards being electrically connected to each other, and a gap between the wiring boards being sealed with a resin, wherein a bonding pad formed on one of the wiring boards is electrically connected to an electrode of the electronic component by a bonding wire, and at least a connection portion between the electrode of the electronic component and the bonding wire is coated with a protection material.

According to a second aspect of the invention, there is provided the electronic component built-in substrate according to the first aspect, wherein the connection portion between the electrode of the electronic component and the bonding wire is coated with the protection material in a state in which a connection portion between the bonding wire and the one of the wiring boards, and a top-most part of a wire loop formed of the bonding wire are exposed.

Consequently, a range coated with the protection material can be kept to a minimum. Accordingly, the thickness and the planar dimension of the electronic component built-in substrate can be reduced. Thus, the electronic component built-in substrate can be compacted.

According to a third aspect of the invention, there is provided the electronic component built-in substrate according to the first or the second aspect, wherein a solder ball is used for electrically connecting the wiring boards.

Further, according to a forth aspect of the invention, there is provided the electronic component built-in substrate of the third aspect, wherein the solder ball is a core-contained solder ball formed by coating an outer surface of a spherical body, which is formed of an electrically conductor as a core, with solder.

Consequently, the upper and lower wiring boards can surely be connected to each other. According to an embodiment of this electronic component built-in substrate of the invention, the solder ball is a core-contained solder ball formed by coating an outer surface of a spherical body, which is formed of an electrically conductor, with solder. Thus, even when the solder ball is reflowed, the electrically conductive core remains. Consequently, the electrical connection can be established by maintaining the clearance between the upper and lower wiring boards at a constant value. An electronic component built-in substrate of a thin structure having a high degree of flatness can be provided.

According to a fifth aspect of the invention, there is provided a method of manufacturing an electronic component built-in substrate, including the steps of:

mounting an electronic component at a predetermined portion of a first wiring board, performing wire-bonding to electrically connect a bonding pad formed on the first wiring board to an electrode of the electronic component by a bonding wire, coating at least a connection portion between the electrode of the electronic component and the bonding wire with a protection material, arranging the first wiring board and a second wiring board so that one side surface of the second wiring board formed separately from the first wiring board faces one surface of the first wiring board, and electrically connecting the first wiring board and the second wiring board to each other by reflowing a solder ball, reflowing the solder ball to clean a portion between the first wiring board and the second wiring board, and sealing a portion between the first wiring board and the second wiring board.

Further, according to a sixth aspect of the invention, there is provided the method of manufacturing an electronic component built-in substrate according to the fifth aspect, wherein in the step of coating the connection portion between the electrode of the electronic component and the bonding wire with a protection material, the connection portion between the electrode of the electronic component and the bonding wire is coated with the protection material in a state in which a connection portion between the bonding wire and the bonding pad of the first wiring board, and a top-most part of a wire loop formed of the bonding wire are exposed.

Effects of the Invention

In accordance with an electronic component built-in substrate and the manufacturing method therefor according to the invention, the planar dimension (i.e., the plane area) and the height dimension of the electronic component built-in substrate can considerably be reduced. Also, a small electronic component built-in substrate having high reliability of the electrical connection can be provided at low cost. Additionally, a burden imposed on the manufacture of a mold for transfer molding can be reduced.

BEST MODE FOR CARRYING OUT THE INVENTION

First Embodiment

Figure 1:
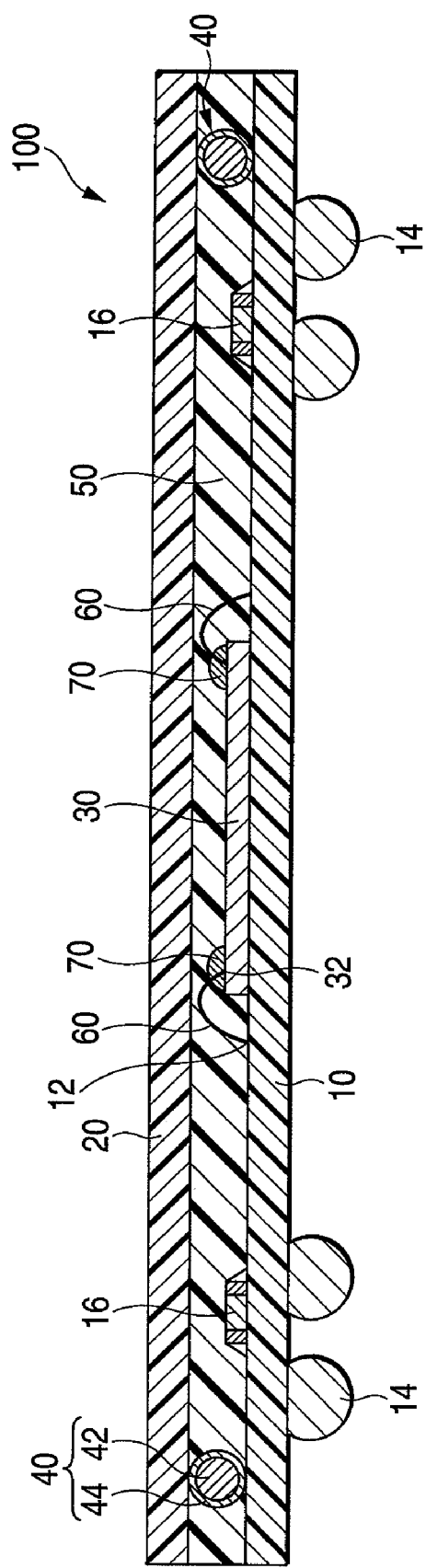
FIG. 1 is a transverse cross-sectional view illustrating an electronic component built-in substrate according to a first embodiment of the invention.
Figure 2:
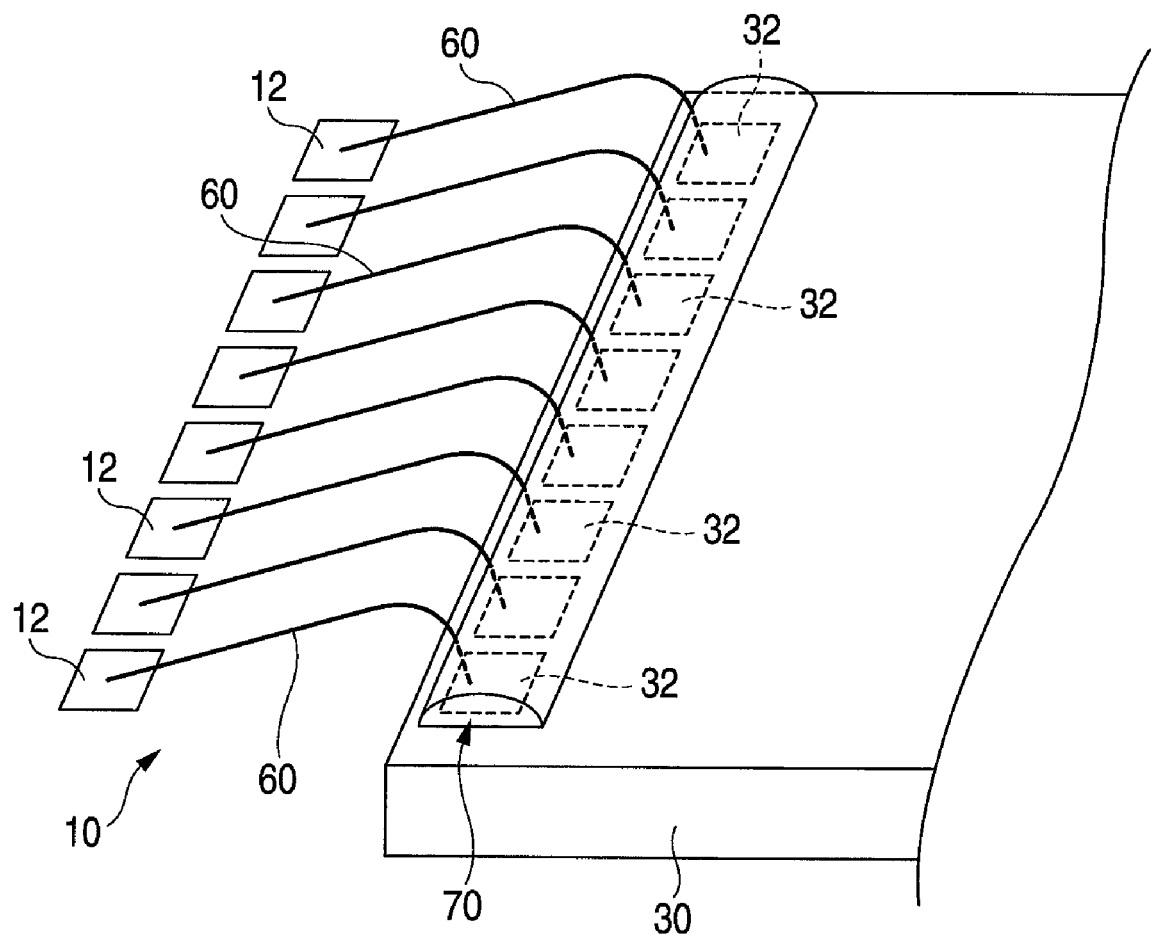
FIG. 2 is a schematic view illustrating a wire-bonding portion between an electronic component and the substrate.

Hereinafter, an embodiment of an electronic component built-in substrate according to the invention is described with reference to the accompanying drawings. FIG. 1 is a transverse cross-sectional view illustrating an electronic component built-in substrate according to the present embodiment of the invention. FIG. 2 is a schematic view illustrating a state of a wire-bonding portion between an electronic component and the substrate.

An electronic component built-in substrate 100 according to the present embodiment is configured so that electronic component 30 is mounted between two wiring boards 10 and 20, and that a lower layer side wiring board 10 serving as a first wiring board is electrically connected to an upper layer side wiring board 20 by solder balls 40. A seal resin 50 is injected into a gap between the lower layer side wiring board 10 and the upper layer side wiring board 20. Incidentally, in this figure, the indication of wiring formed on each of the wiring boards 10 and 20 is omitted.

A bump 14 serving as an external connection terminal, which is exemplified by solder, is provided on the bottom surface of the lower layer sideboard 10. On the other hand, the electronic component 30, such as a semiconductor chip, is placed on the top surface of the lower layer side wiring board 10, in addition to circuit parts, such as chip-capacitors, chip-resistors, and inductors. The circuit parts 16 are attached to the wiring (not shown) formed on the lower layer side wiring board 10 by soldering. The electronic component 30 is attached to the lower layer side wiring board 10 by an adhesive agent. Subsequently, the electrode 32 of the electronic component 30 is wire-bonded to and the bonding pad 12 of the lower layer side wiring board 10 by a bonding wire 60.

The bonding pad 12 provided in the lower layer side wiring board 10 is formed by performing gold-plating on a copper pad. An electrode 32 serving as a connection portion provided on the electronic component 30 is made of aluminum.

The upper layer side wiring board 20 is placed on the lower layer side wiring board 10. The lower layer side wiring board 10 and the upper layer side wiring board 20 are electrically connected to each other, using wiring-patterns (not shown) formed on the wiring boards 10 and 20 and the solder balls 40. The present embodiment uses copper-core-contained solder balls 40 obtained by coating outer surfaces of copper cores 42, which are made of electrically conductive copper materials and are formed into spherical bodies, with solders 44. The lower layer side wiring board 10 and the upper layer side wiring board 20 are electrically connected to each other through the copper cores 42 by reflowing the solders 44 of the solder balls 40. The lower layer side wiring board 10 and the upper layer side wiring board 20 are connected to each other in a state in which the wiring boards 10 and 20 are separated from each other by a distance that is equal to at least the diameter dimension of each of the copper cores 42.

Incidentally, for convenience of description, FIG. 1 illustrates the outer peripheries of the solder balls 40, each of which contains the copper core 42, as being coated with the solders 44 even after reflowed. However, when each actual solder ball 40 having the copper core 42 is reflowed, apparently, the copper core 42 and the solder 44 are not concentrically spherical.

When the solders 44 of the solder balls 40 are molten, the top surface of the lower layer side wiring board 10, the top surface and the side surfaces of the electronic component 30, and the bottom surface of the upper layer side wiring board 20 are contaminated with fluxes. It is necessary to inject a seal resin 50 into between the lower layer side wiring board 10 and the upper layer side wiring board 20 so as to provide the electronic component built-in substrate 100 with a sufficient mechanical strength and as to protect the electronic component 30 and the circuit parts 16. Also, to enable a seal resin 50 to surely adhere to the lower layer side wiring board 10, the electronic component 30, and the upper layer side wiring board 20, it is necessary to clean between the lower layer side wiring board 10 and the upper layer side wiring board 20 after the reflow of the solders 40. At that time, an acid may be used for removing fluxes. Thus, there is a fear that aluminum of the electrode 32 provided on the electronic component 30 such as a semiconductor chip may be damaged. Thus, it is necessary to protect the electrode 32 of the electronic component 30.

The present embodiment is featured in that upon completion of wire-bonding of the electrode 32 of the electronic component 30 and the bonding pad 12 of the lower layer side wiring board 10, the electrode 32 of the electronic component 30 is coated with a resin 70 before the upper layer side wiring board 20 is arranged on the lower layer side wiring board 10.

As illustrated in FIGS. 1 and 2, an area including the wire bonding electrode portion 32 on the top surface of the semiconductor element 30 is coated with the resin 70. A portion coated with the resin 70 is formed by potting the resin such as an epoxy resin. Preferably, when the portion coated with the resin 70 is formed, the connection portion between a predetermined portion including the top end portion (i.e., the topmost portion) of a wire loop formed of the bonding-wire 60 and the bonding pad 12 of the lower layer side wiring board 10 is exposed from the resin 70. Consequently, the height dimension and the planar dimension of the portion coated with the resin 70 can be reduced. This is useful for the miniaturization of the electronic component built-in substrate 100. Additionally, the bonding pad 12 of the lower layer side wiring board 10 and the bonding wire 60 are made of gold. There is no fear that the connection portion may be degraded by being exposed, and that the wire-bonded part may be damaged in the case of using chemicals such as acids.

Thus, the electrode 32 of the semiconductor element 30 is coated with the resin 70 having a resistance to chemicals. Accordingly, even when cleaning between the wiring boards using a strong cleaning solution, the reliability of the electronic connection between the electrode 32 and the bonding wire 60 can be maintained.

Also, the mechanical strength of the connection between the electrode 32 and the bonding wire 60 can be enhanced. Because the resin 70 serving as the protection material coats only a minimum range (extending in both height and width directions) including the electrode 32 of the electronic component 30, the height dimension and the width dimension of the range coated with the resin 70 can considerably be reduced, as compared with the sizes in both height and width directions of the range coated with the resin by the transfer-molding according to the related art.

For a similar reason, the clearance between the opposed surfaces of the lower layer side wiring board 10 and the upper layer side wiring board 20 can be determined by the height of the wire loop. Thus, the diameter dimension of each of the solder balls 40 can be decreased. The thickness dimension of the electronic component built-in substrate 100 can be reduced by using such small-diameter solder balls 40. Also, a provision pitch, at which the solder balls 40 are provided, can be narrowed. Consequently, the plane area of the electronic component built-in substrate 100 can be reduced.

Additionally, due to the decrease in the width dimension (i.e., the plane area) of the range coated with the resin 70, the solder balls 40 can be provided at positions close to the electronic components 30. Consequently, the area of the entire electronic component built-in substrate 100 can be further reduced.

In a case where the entire bonding wire 60 is covered with the resin 70 serving as the protection material, the reduction in the thickness dimension and the plane-area dimension of the electronic component built-in substrate 100 are slightly hindered. However, the bonding wire 60 can be protected from deformation and accidents, such as a breaking of the wire, until the gap between the lower layer side wiring board 10 and the upper layer side wiring board 20 is sealed with the seal resin 50. Consequently, the reliability of the electrical connection by wire-bonding can be enhanced.

Thus, in the electronic component built-in substrate 100, the minimum range including the electrode 32 of the electronic component 30 is protected by the resin 70. Accordingly, the upper layer side wiring board 20 serving as the second wiring board can be arranged on the lower layer side wiring board 10 serving as the first wiring board without reducing the reliability of the electrical connection between the lower layer side wiring board 10 and the electronic component 30. Also, the thickness and the area of the electronic component built-in substrate 100 can considerably be reduced. Although most of the bonding wire 60 protrudes from the resin 70 in the present embodiment, the bonding wire 60 can sufficiently be protected. This is because the seal resin 50 is injected into between the lower layer side wiring board 10 and the upper layer side wiring board 20, so that the bonding wire 60 is sealed with the seal resin 50.

Second Embodiment

Figure 3:
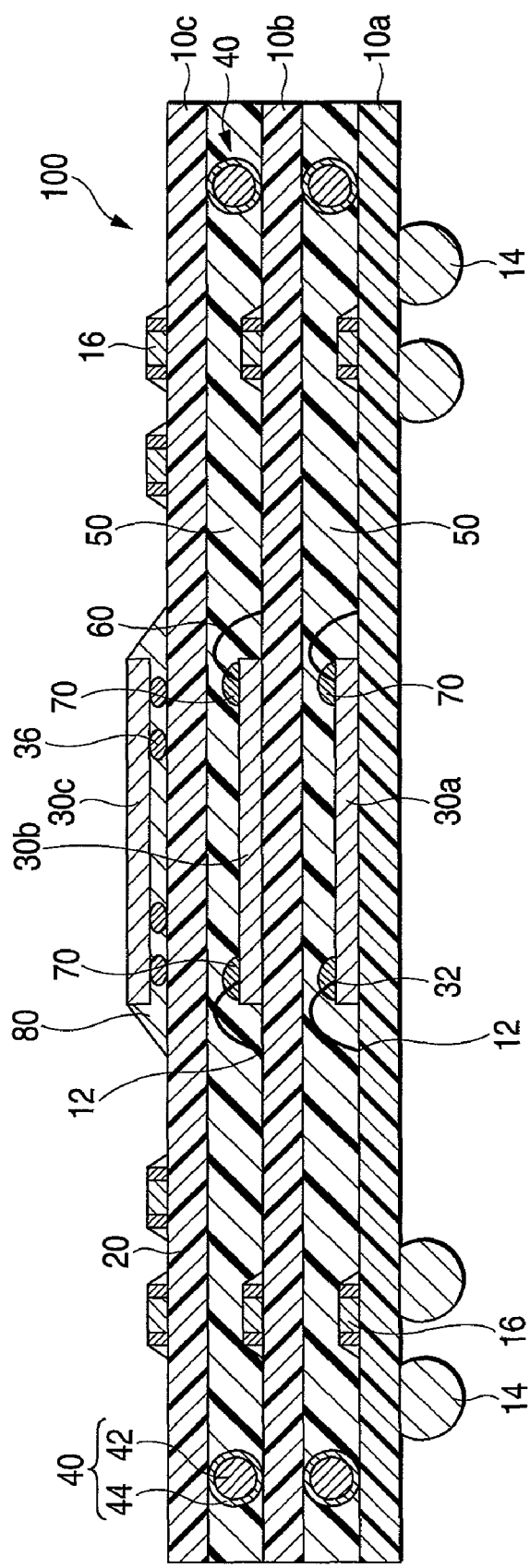
FIG. 3 is a transverse cross-sectional view illustrating the structure of an electronic component built-in substrate according to a second embodiment of the invention.

FIG. 3 is a transverse cross-sectional view illustrating the structure of an electronic component built-in substrate according to a second embodiment of the invention. According to the present embodiment, the electronic component built-in substrate 100 is configured as follows. That is, three wiring boards 10a, 10b, and 10c are arranged in the direction of a thickness. A semiconductor element 30a serving as an electronic component is mounted between the wiring boards 10a and 10b. Also, a semiconductor element 30b serving as an electronic component is mounted between the wiring boards 10b and 10c. The semiconductor elements 30a and 30b are wire-bonded to each other. Thus, the wiring boards 10a and 10b are electrically connected to each other by solder balls 40. Also, the wiring boards 10b and 10c are electrically connected to each other by solder balls 40. As illustrated in this figure, a semiconductor element 30c and a circuit part 16 can be mounted or provided on the top surface of the wiring board 10c provided at a top-most portion of the electronic component built-in substrate 100. Although, the semiconductor element 30c is flip-chip-connected to the top surface of the wiring board 10c, as illustrated in FIG. 3, a wire-bonding connection can be employed, in stead of the flip-chip connection.

The semiconductor elements 30a and 30b are electrically connected to the wiring boards 10a and 10b by being connected thereto through the wire-bonding connection. At least, the connection between the bonding wire 60 and the electrode 32 of each of the electronic components 30a and 30b is coated by potting a resin 70 serving as a protection material.

The circuit part 16 provided on the top surface of the wiring board 10c is connected thereto by soldering. An underfill resin 80 is injected into between the semiconductor element 30c and the wiring board 10c.

Third Embodiment

Figure 4:
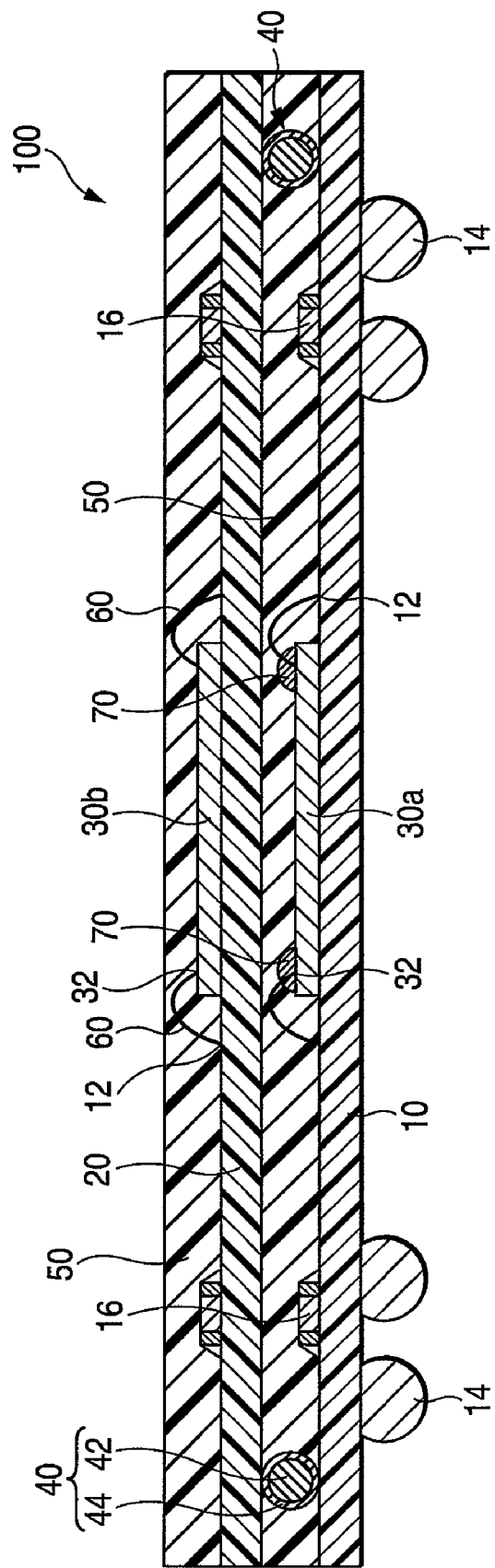
FIG. 4 is a transverse cross-sectional view illustrating the structure of an electronic component built-in substrate according to a third embodiment of the invention.

FIG. 4 is a transverse cross-sectional view illustrating the structure of an electronic component built-in substrate according to a third embodiment of the invention.

According to the present embodiment, a semiconductor element 30b is mounted on the top surface of the upper layer side wiring board 20 of the electronic component built-in substrate 100 described in the foregoing description of the first embodiment. The semiconductor element 30b is wire-bonded to the upper layer side wiring board 20. The semiconductor element 30b is sealed with the seal resin 50.

In the case of employing the present embodiment, after the semiconductor element 30b is mounted on the top surface of the upper layer side wiring board 20 and is wire-bonded thereto, the semiconductor element 30b is sealed with the seal resin 50. The solder ball 40 is preliminarily bonded to the bottom surface of the upper layer side wiring board 20 (that is, an existing semiconductor device of the BGA (Ball Grid Array) type can be utilized). It is advisable to arrange the upper layer side wiring board 20, which is preliminarily fabricated into a semiconductor apparatus of the BGA type, on the top surface of the lower layer side wiring board 10 to which the semiconductor element 30a, whose electrode 32 is protected by the resin 70, is wire-bonded. The solder balls 40 are reflowed. Then, the electrical connection between the lower layer side wiring board 10 and the upper layer side wiring board 20 is established. Subsequently, the seal resin 50, such as an epoxy resin, is injected into between the lower layer side wiring board 10 and the upper layer side wiring board 20 so as to seal therebetween. Thus, the electronic component built-in substrate 100 illustrated in FIG. 4 is completed.

According to the present embodiment, the board of the semiconductor apparatus of the BGA type, which has already been provided, can be utilized as the upper layer wiring board 20. Consequently, the high-density electronic component built-in substrate 100 can be provided.

Fourth Embodiment

Figure 5:
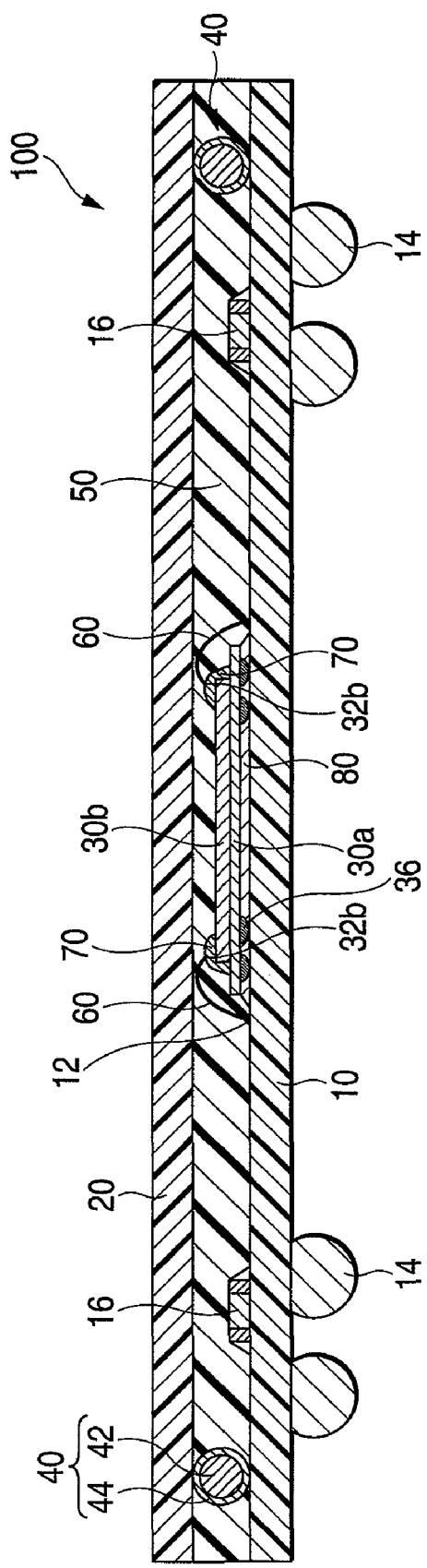
FIG. 5 is a transverse cross-sectional view illustrating the structure of an electronic component built-in substrate according to a fourth embodiment of the invention.
Figure 14:
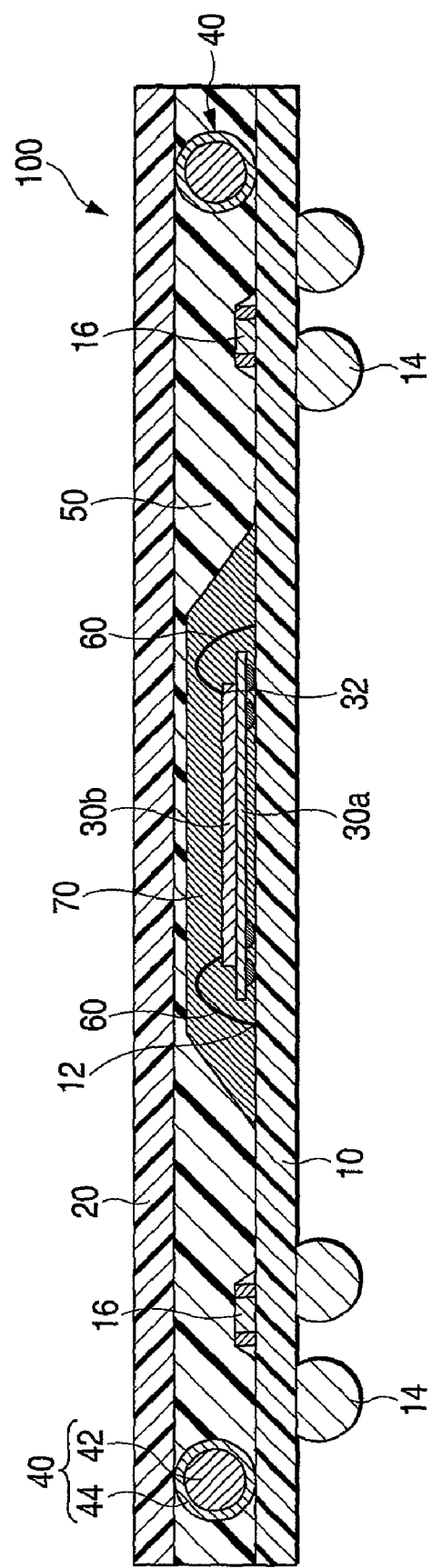
FIG. 14 is a transverse cross-sectional view illustrating the first improved structure of an electronic component built-in substrate in which an electronic component is mounted on a wiring board by wire-bonding.

FIG. 5 is a transverse cross-sectional view illustrating the structure of an electronic component built-in substrate according to a fourth embodiment of the invention. More specifically, FIG. 5 is a schematic view illustrating a state of the electronic component built-in substrate obtained by applying the invention to an electronic component built-in substrate illustrate in FIG. 14. In the following description of the present embodiment, reference numerals designating members having been described in the description of the first embodiment are used. Thus, the description of each of such members is omitted.

In the electronic component built-in substrate 100 according to the present embodiment, a first semiconductor element 30a is flip-chip-connected to a first layer side wiring board 10. A second semiconductor element 30b is arranged on the first semiconductor element 30a. An electrode 32b of the second semiconductor element 30b is wire-bonded to the bonding pad 12 of the lower layer side wiring board 10. The first semiconductor element 30a and the second semiconductor element 30b are connected to each other by an adhesive agent.

As illustrated in FIG. 5, the first semiconductor element 30a is flip-chip-connected to the lower layer side wiring board 10 by bumps 36 made of solder. Subsequently, an underfill resin 80 is injected into between the wiring boards 10 and 20. Thus, even in a case where the substrate undergoes a cleaning step after the wiring boards 10 and 20 are connected to each other by using solder balls 40, the reliability of the electrical connection between the lower layer side wiring board 10 and the first semiconductor element 30a is not degraded. In a case where the material of the electrode 32b of the second semiconductor element 30b is that of the aluminum pad, whose resistance to chemicals is low, the electrode 32b needs coating with the resin 70 having a resistance to chemicals, similarly to the aforementioned embodiments. In the present embodiment, a part of the top surface of the second semiconductor element 30b, which includes the connection portion between the electrode 32b of the second semiconductor element 30b and a bonding wire 60, is coated by potting the resin 70 serving as the protection material. According to an amount of the potted resin 70, not only the top surface of the semiconductor element 30b and but a side surface thereof may be coated with the resin 70, as illustrated in FIG. 5.

Even in this case, the dimension in the direction of height of the resin 70 can be reduced by exposing a top-most part of a wire loop formed of the bonding wire 60 connected to the electrode 32b of the second semiconductor element 30b and the bonding pad 12 of the lower layer side wiring board 10. This contributes reduction in the thickness of the electronic component built-in substrate 100.

Fifth Embodiment

Figure 6:
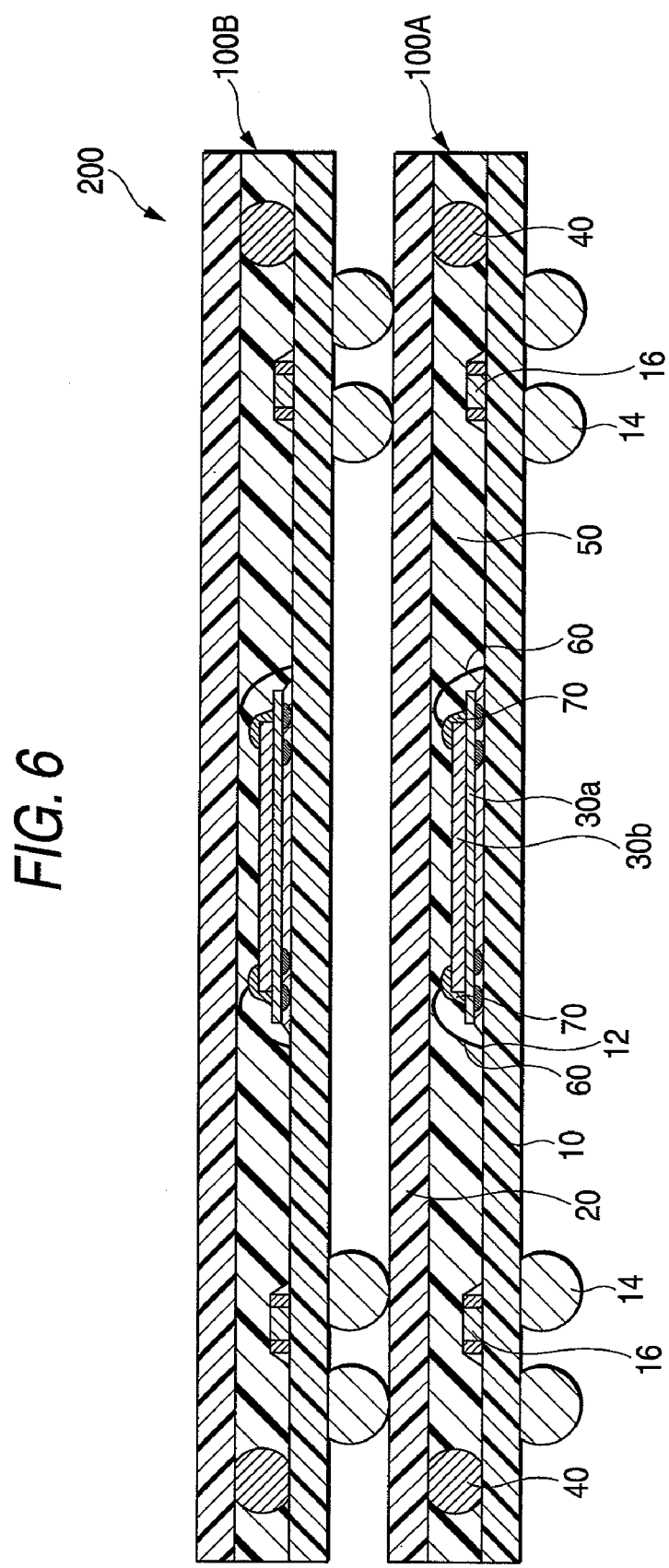
FIG. 6 is a transverse cross-sectional view illustrating the configuration of an electronic component package of a POP structure using an electronic component built-in substrate according to the invention.

Although the electronic component built-in substrate 100 has been described in the foregoing description of each of the aforementioned embodiments, the invention can be applied to an electronic component package 200 of a PoP (Package-on-Package) structure containing electronic components, in addition to the electronic component built-in substrate 100. FIG. 6 is a transverse cross-sectional view illustrating the configuration of an electronic component package of a PoP structure using an electronic component built-in substrate according to the invention. The electronic component package 200 of the PoP structure is formed by arranging the electronic component built-in substrates (i.e., semiconductor packages) 100A and 100B, which have been described in the foregoing description of the fourth embodiment, in the direction of thickness.

The thickness dimension and the planar dimension of the electronic package can considerably be reduced by employing the present embodiment. Also, the electronic component package 200 of the PoP structure having high reliability of the electrical connection can be provided.

(Method of Manufacturing Electric Part Built-in Substrate)

Next, a method of manufacturing the electronic component built-in substrate 100 according to the first embodiment is described below. FIGS. 7 to 11 are cross-sectional views illustrating states of the electronic component built-in substrate 100 in steps of a manufacturing process thereof according to the invention. Incidentally, known methods can be employed as methods of forming wiring patterns on the lower layer side wiring board 10 and the upper layer side wiring board 20. Therefore, the detail description of these methods is omitted herein.

Figure 7:
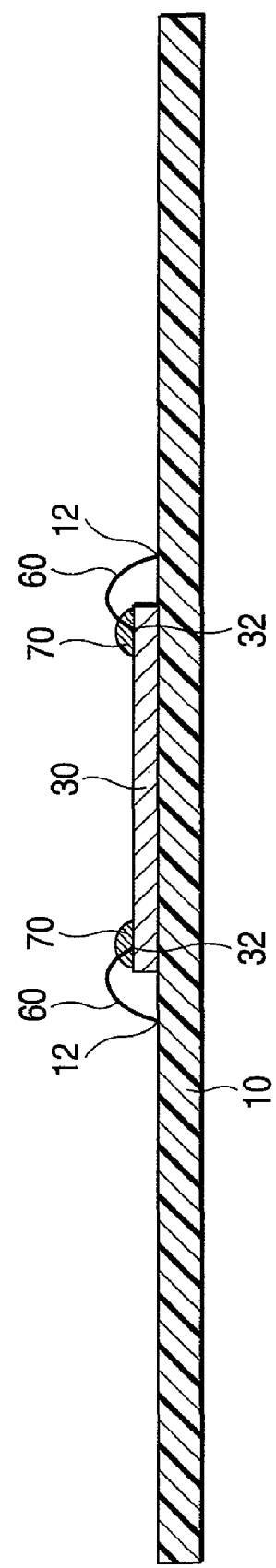
FIG. 7 is a cross-sectional view illustrating a state of an electronic component built-in substrate in a step of a manufacturing process thereof according to the invention.

As illustrated in FIG. 7, a semiconductor element 30 serving as an electronic component is positioned and put on the lower layer side wiring board 10 serving as the first wiring board. The semiconductor element 30 is bonded to the lower layer side wiring board 10 through an adhesive agent. After the semiconductor element 30 is put thereon, the electrode 32 of the semiconductor element 30 and the bonding pad 12 of the lower layer side wiring board 10 are connected to each other by the bonding wire 60. The semiconductor element 30 and the wiring pattern formed on the lower layer side wiring board 10 are electrically connected to each other. The electrode 32 is coated with the resin 70, such as an epoxy resin, by potting the resin 70 thereto. The resin 70 is hardened at that time.

Figure 8:
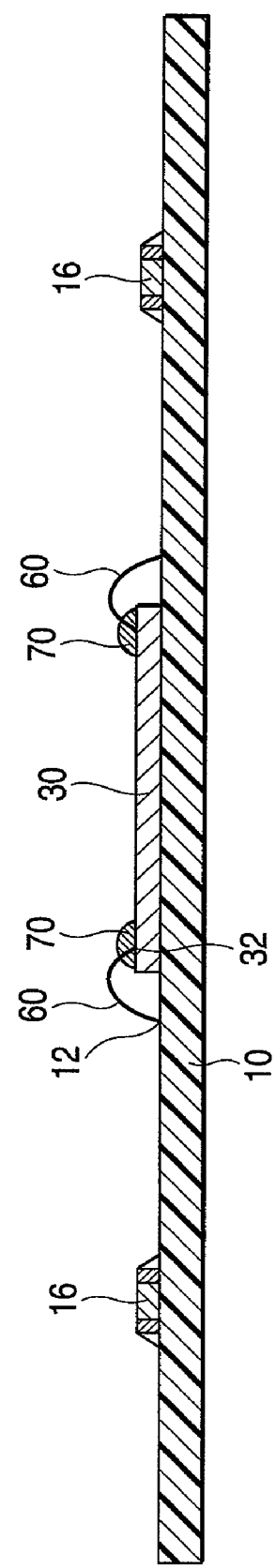
FIG. 8 is a cross-sectional view illustrating a state of the electronic component built-in substrate in a step of a manufacturing process thereof according to the invention.

Next, as illustrated in FIG. 8, the circuit part 16 is connected to an exposed part of the wiring pattern formed on the lower layer side wiring board 10 by solder. Although the semiconductor element 30 has already been mounted on the lower layer side wiring board 10 by wire-bonding connection, the electrode 32 is coated with the resin 70 serving as the protection material. Thus, when the circuit part 16 is mounted on the lower layer side wiring board 10, the electrode 32 is not damaged by fluxes and solders. That is, the reliability of the electrical connection between the lower layer side board 10 and the semiconductor element 30 can be maintained.

Figure 9:
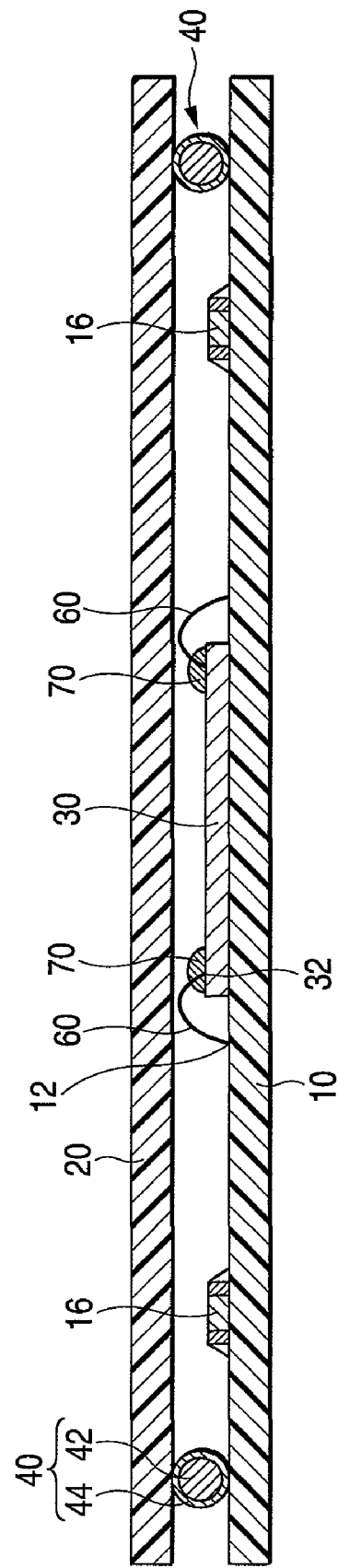
FIG. 9 is a cross-sectional view illustrating a state of the electronic component built-in substrate in a step of a manufacturing process thereof according to the invention.

Next, as illustrated in FIG. 9, the upper layer side wiring board 20 serving as the second wiring board, to the bottom surface of which the solder balls 40 each having the copper core 42 are connected, is positioned and placed on the top surface of the lower layer side wiring board 10. The diameter dimension of each of the solder balls 40 is set so that the diameter dimension of an associated copper core 42 is larger than the clearance between the height position of the top surface of the lower layer side wiring board 10 and the height position of the top end surface (i.e., the top-most part) of the wire loop of the bonding wire 60.

After the upper side layer wiring board 20 is positioned and placed on the lower layer side wiring board 10, the solder balls 40 are reflowed. Thus, the solder covering the outer peripheral of the copper core 42 is molten, so that the lower layer side wiring board 10 and the upper layer side wiring board 20 are electrically connected to each other. Upon completion of reflowing of the solder balls 40, a cleaning operation is performed so as to remove fluxes that remain in the space between the lower layer side wiring board 10 and the upper layer side wiring board 20. Sometimes, acids are used as cleaning chemicals. However, the electrode 32 of the semiconductor chip 30 is coated with the resin 70 serving as the protection material. Thus, the reliability of the electrical connection between the electrode 32 (made of aluminum) of the semiconductor chip 30 and the bonding wire 60 can be maintained at the same level as that at connecting the bonding wire 60 to the electrode 32.

Figure 10:
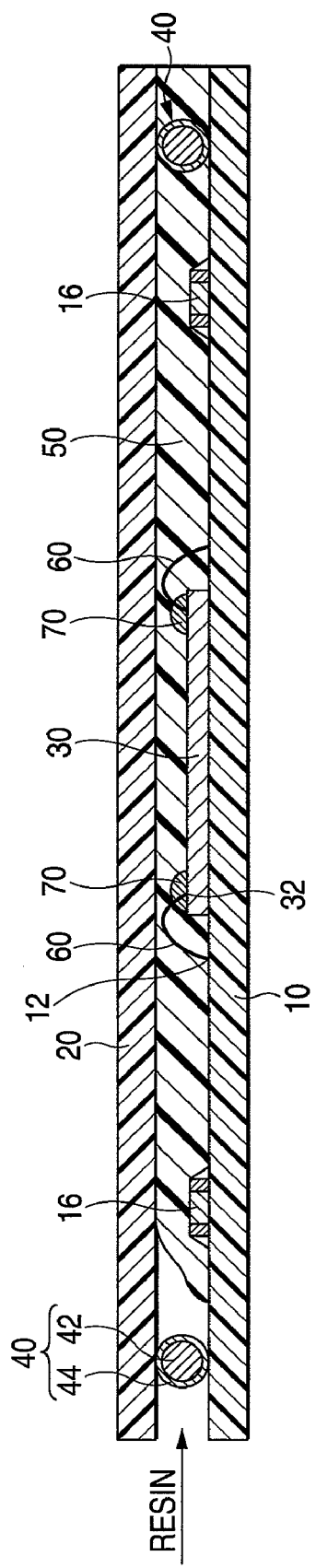
FIG. 10 is a cross-sectional view illustrating a state of the electronic component built-in substrate in a step of a manufacturing process thereof according to the invention.

Next, as illustrated in FIG. 10, the seal resin 50 is injected into between the lower layer side wiring board 10 and the upper layer side wiring board 20. The seal resin 50 is injected thereinto by transfer-molding or performing a method of casting of a resin thereinto utilizing a capillary phenomenon.

Thus, the space between the lower layer side wiring board 10 and the upper side wiring substrate 20 is filled with the seal resin 50. The bonding wire 60, which has not been coated with the resin 70 serving as the protection material, is protected by the seal resin 50.

Figure 11:
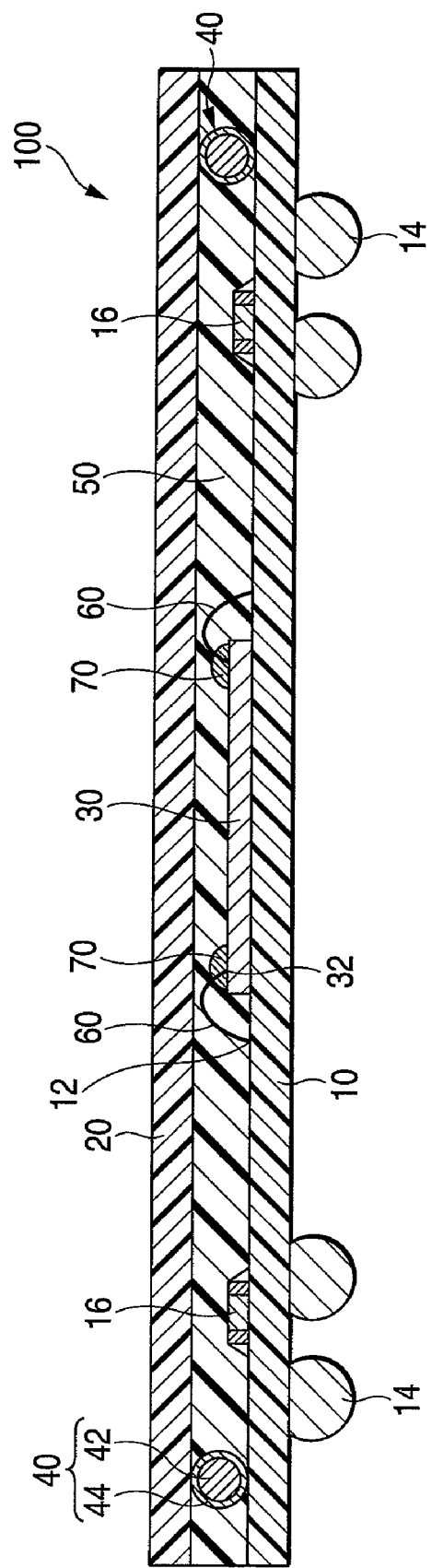
FIG. 11 is a cross-sectional view illustrating a state of the electronic component built-in substrate in a step of a manufacturing process thereof according to the invention.
Figure 12:
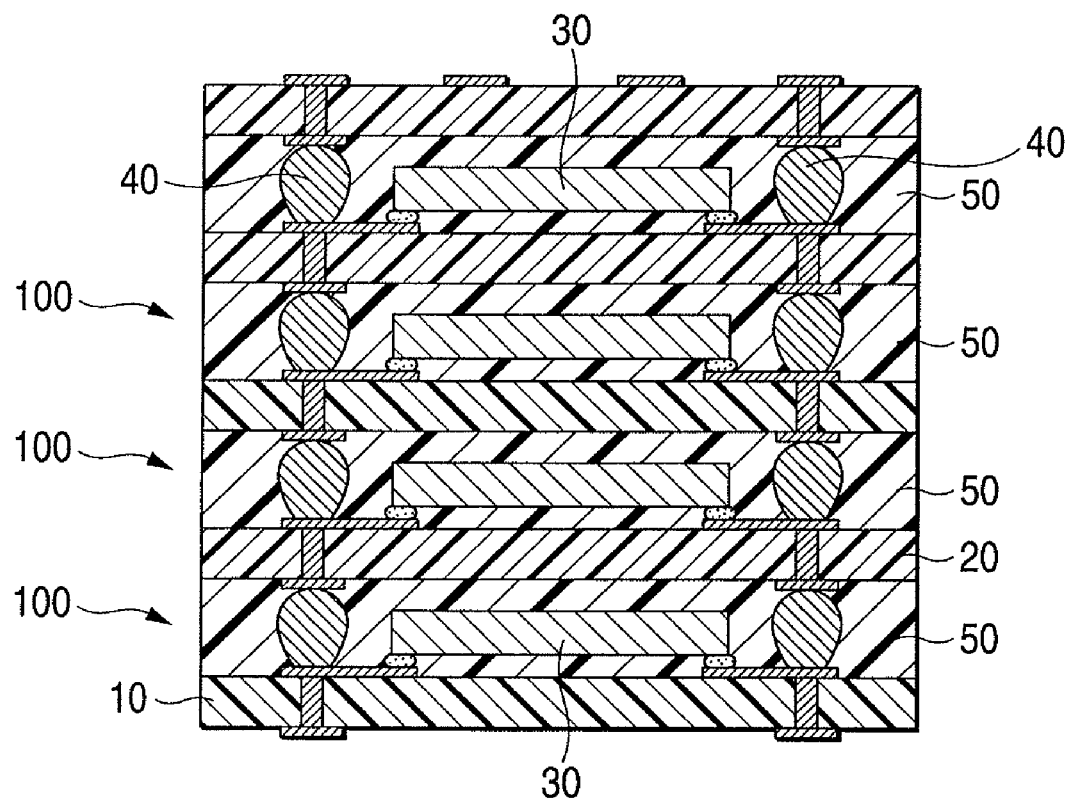
FIG. 12 is a transverse cross-sectional view illustrating a related structure of an electronic component built-in substrate in which an electronic component is mounted between wiring boards and in which the gap between the wiring boards is sealed with a resin.
Figure 13:
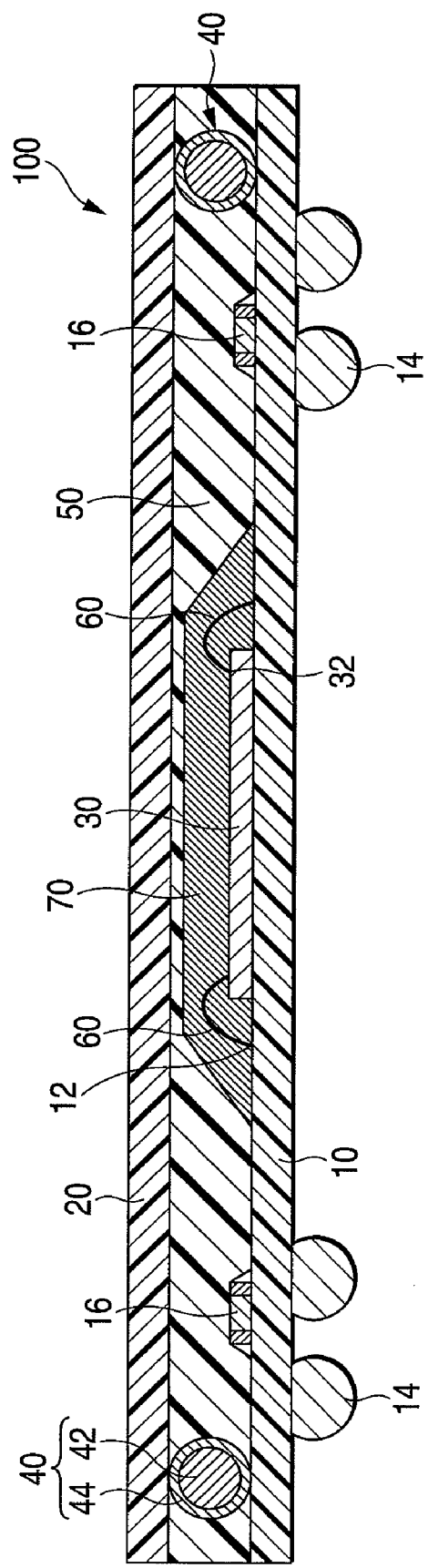
FIG. 13 is a transverse cross-sectional view illustrating a first improved structure of an electronic component built-in substrate in which an electronic component is mounted on a wiring board by wire-bonding.

Upon completion of injection of the seal resin 50, the bumps 14 made of solder or the like is connected to the bottom surface of the lower side layer wiring board 10, as illustrated in FIG. 11. Thus, the electronic component built-in substrate 100 is completed.

In the foregoing description, the electronic component built-in substrates 100 and the package of the PoP structure using the electronic component built-in substrates 100 have been described in detail, based on the description of the embodiments. However, the invention is not limited to the aforementioned embodiments. Apparently, various modifications made without departing from the spirit of the invention are included in the technical scope of the invention.

For example, although the embodiments have been described by employing semiconductor elements as the electronic components 30, the electronic components 30 are not limited thereto. Apparently, other electronic components can be used.

Also, when a plurality of electronic components 30a and 30b are arranged in an up-down direction between the lower layer side wiring board 10, which serves as the first wiring board, and the upper layer side wiring board 20, which serves as the second wiring board, as described in the foregoing description of the fourth embodiment, the lower side layer electronic component (i.e., the semiconductor element) 30a can be connected to the lower layer side wiring board 10 by wire-bonding, instead of flip-chip-connecting.

What is claimed is:

1. A method of manufacturing an electronic component built-in substrate, comprising the steps of:
   mounting an electronic component at a predetermined portion of a first wiring board;
   performing wire-bonding to electrically connect a bonding pad formed on the first wiring board to an electrode of the electronic component by a bonding wire;
   coating at least a connection portion between the electrode of the electronic component and the bonding wire with a protection material;
   arranging the first wiring board and a second wiring board so that one side surface of the second wiring board formed separately from the first wiring board faces one surface of the first wiring board with the electronic component disposed between the first wiring board and the second wiring board, and electrically connecting the first wiring board and the second wiring board to each other by reflowing a solder ball;
   reflowing the solder ball to clean a portion between the first wiring board and the second wiring board; and
   sealing a portion between the first wiring board and the second wiring board with a sealing material that is in addition to and distinct from the protection material by casting the sealing material with a capillary action such that the sealing material covers and contacts the one side surface of the second wiring board and the one surface of the first wiring board and fills the portion between the first wiring board and the second wiring board.

2. The method of manufacturing an electronic component built-in substrate according to claim 1, wherein
   in the step of coating the connection portion between the electrode of the electronic component and the bonding wire with the protection material,
   the connection portion between the electrode of the electronic component and the bonding wire is coated with the protection material in a state in which a top-most part of a wire loop formed of the bonding wire is exposed.

3. The method of manufacturing an electronic component built-in substrate according to claim 1, wherein the sealing material completely fills the portion between the first wiring board and the second wiring board.

4. The method of manufacturing an electronic component built-in substrate according to claim 1,
   wherein the sealing material is formed of resin.

5. The method of manufacturing an electronic component built-in substrate according to claim 1, wherein the solder ball is a core-contained solder ball formed by coating an outer surface of a spherical body, which is formed of an electrical conductor as a core, with solder.

6. The method of manufacturing an electronic component built-in substrate according to claim 1,
   wherein the electronic component comprises a first electronic component and a second electronic component, and
   wherein the first electronic component is disposed on one of the wiring boards and the second electronic component is disposed on the first electronic component.

7. An electronic component built-in substrate, comprising:
   a first wiring board comprising a first pad and a bonding pad thereon;
   a second wiring board comprising a second pad thereon and facing the first wiring board with a gap interposed therebetween such that the first pad and the second pad face each other;
   a solder ball comprising a core and a solder covering at least a portion of the core, the solder ball being provided between the first wiring board and the second wiring board so as to electrically connect the first wiring board and the second wiring board, wherein portions of the core exposed from the solder directly contact the first pad and the second pad;
   an electronic component comprising an electrode thereon and mounted on the first wiring board such that the electrode is electrically connected to the bonding pad through a bonding wire;
   a sealing resin that seals the gap between the first wiring board and the second wiring board such that the sealing resin covers and contacts facing surfaces of the first and second wiring boards and fills the gap,
   wherein at least a connection portion between the electrode and the bonding wire is coated with a protection material which is in addition to and distinct from the sealing resin,
   wherein the minimum distance of the gap between the first wiring board and the second wiring board is substantially equal to the diameter of core of the solder ball,
   wherein the bonding wire has a wire loop portion, a top of the wire loop portion is exposed from the protection material, and
   wherein the minimum distance between the top of the wire loop portion and the facing surface of the first wiring board is smaller than the diameter of the core of the solder ball.

8. The electronic component built-in substrate according to claim 7, wherein the resin completely fills the gap.

9. The electronic component built-in substrate according to claim 7,
   wherein the electronic component comprises a first electronic component and a second electronic component, and
   wherein the first electronic component is disposed on one of the wiring boards and the second electronic component is disposed on the first electronic component.

10. The substrate of claim 7, wherein
    the electrode comprises a plurality of electrodes, the bonding pad comprises a plurality of boding pads, and the bonding wire comprises a plurality of bonding wires, the plurality of electrodes are arranged in a line along a side of the electronic component, and the plurality of boding pads are arranged in a line, and
    each of the plurality of electrodes is electrically connected to a corresponding one of the plurality of the bonding pads through a corresponding one of the plurality of bonding wires.

* * * * *